United States Patent [19]

Schaible

[11] 4,185,242
[45] Jan. 22, 1980

[54] SIGNAL-TO-NOISE RATIO MEASUREMENT OF INTERMITTENT SIGNALS

[75] Inventor: Clifford W. Schaible, Morristown, N.J.

[73] Assignee: Bell Telephone Laboratories, Incorporated, Murray Hill, N.J.

[21] Appl. No.: 888,243

[22] Filed: Mar. 20, 1978

[51] Int. Cl.² .......................................... H04B 17/00
[52] U.S. Cl. ................................. 325/363; 324/57 N
[58] Field of Search ................ 325/67, 363, 398, 478, 325/410, 473; 324/57 N

[56] References Cited

U.S. PATENT DOCUMENTS

| 3,238,457 | 3/1966 | Boymel et al. | 325/67 |
| 3,302,116 | 1/1967 | Free | 325/363 |
| 3,602,819 | 8/1971 | Abbott | 325/363 |
| 3,831,093 | 8/1974 | Walker | 325/363 |

*Primary Examiner*—Robert L. Richardson
*Assistant Examiner*—Jin F. Ng
*Attorney, Agent, or Firm*—Roy C. Lipton

[57] ABSTRACT

The signal-to-noise ratio of intermittent reception by a radio receiver from a push-to-talk transmitter is measured by comparing AGC voltage levels derived from a signal period with levels derived from the prior no-signal period containing noise only. The AGC voltages are applied to a pair of integrators having corresponding time constants and therefore normally having equal outputs. When a valid signal period is recognized, the output of one integrator is held to represent an integration of voltage levels during the prior no-signal period. The integrated signal thus held is thereafter compared with the running output of the other.

4 Claims, 1 Drawing Figure

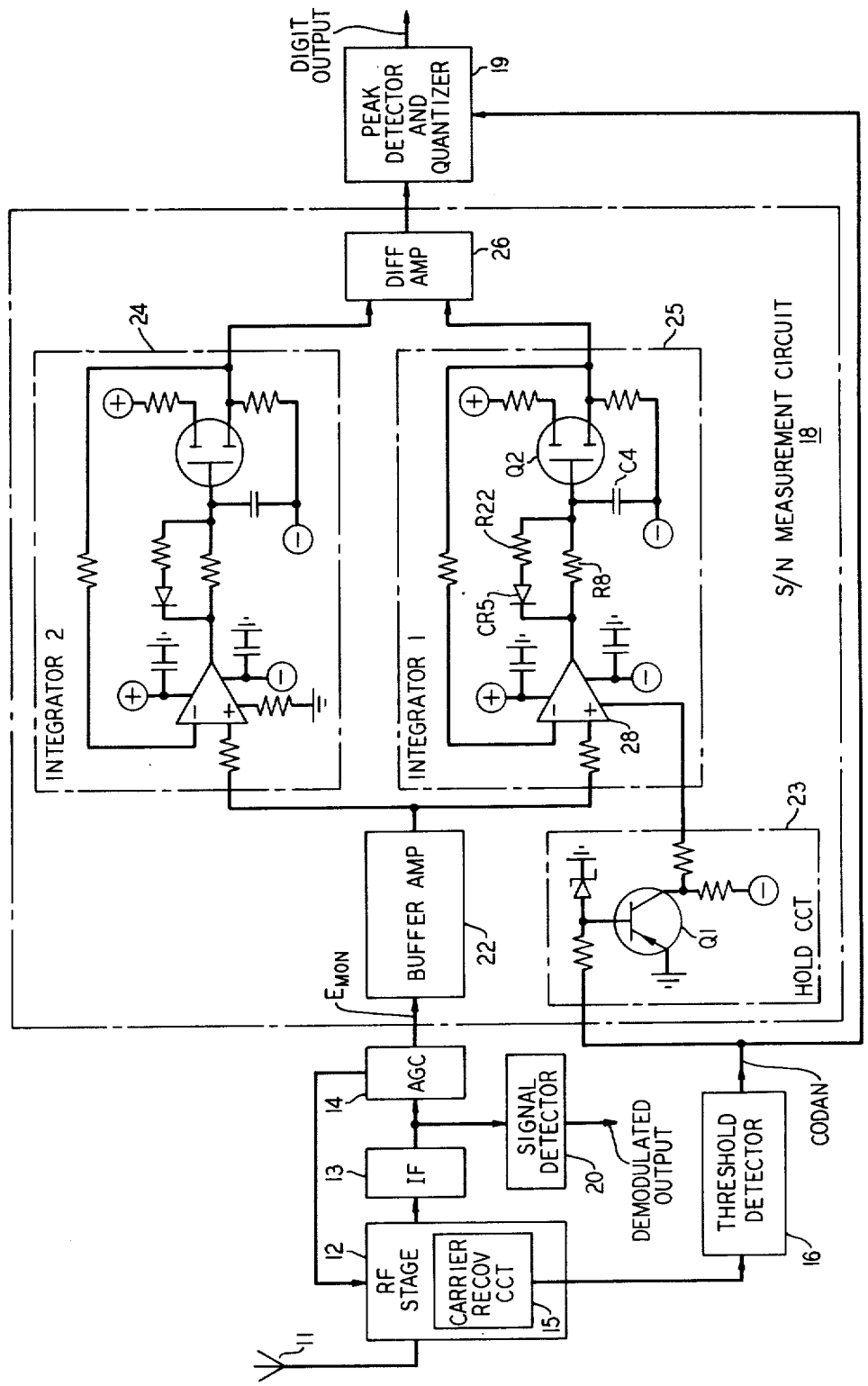

SIGNAL-TO-NOISE RATIO MEASUREMENT OF INTERMITTENT SIGNALS

TECHNICAL FIELD

This invention relates to signal-to-noise ratio detection and, more particularly, to signal-to-noise ratio detection in automatic gain control receivers which are responsive to intermittent reception.

DESCRIPTION OF THE PRIOR ART

In large mobile radio telephone systems such as coastal harbor radio systems, a multiplicity of receivers are designed to receive signals from shipboard transmitters which employ push-to-talk transmission. This results, at the receiver, in intermittent reception which comprises alternate periods of signal and no signal, each signal period containing modulated intelligence and each alternating period being free of carrier as well as modulations. Each fixed location receiver receives the same transmission but only the one receiving via the best transmission path is utilized and this selection requires determination as to which receiver is receiving the best quality input.

The determination of signal quality input has been conveniently accomplished by measuring the receiver signal-to-noise ratio. This ratio has been computed by comparing signal strength levels of a signal period which contains modulated intelligence plus, of course, noise with a no-signal period which contains noise only. The received signal strengths can advantageously be measured by the time-honored method of monitoring automatic gain control (AGC) voltages.

In one known arrangement (U.S. Pat. No. 3,831,093) the receiver includes a carrier operated device anti-noise (CODAN) which detects the valid reception of signals to identify a signal period. An analog indication of the transient AGC voltage swing which occurs upon the termination of this signal period is then generated. The AGC level established during the reception of the modulated signal is compared with a peak value reached prior to the establishment of the stabilized AGC level achieved during the next period when noise alone is received. This comparison will be digitally encoded to define the dB signal-to-noise ratio. One difficulty of this arrangement is that a change in the AGC voltage level due to impulse noise, such as a static burst from a lightning discharge, received during the signal period, might be interpreted as the transient AGC voltage swing from the signal period to the noise-only period. Another problem is that awaiting the termination of the signal period to define the signal-to-noise ratio may comprise intolerable delay.

Accordingly, it is an object to determine signal-to-noise ratio in the presence of impulse noise during signal transmission.

It is a further object to reduce delay in determining the signal-to-noise ratio.

SUMMARY OF THE INVENTION

In accordance with this invention the automatic gain control voltage is delayed and the delayed voltage level which exists at the instant that the CODAN identifies a valid signal is stored. The stored (AGC) level consequently is derived from the immediately prior no-signal noise period. This stored level is then compared with the current delayed signal level derived from the signal period and the peak difference is computed. Since the peak from the current level will be derived from AGC voltages generated in the valid signal period, the computation of the S/N ratio is made prior to the termination of the signal period. In addition, since the comparison is made with a stored level derived from the no-signal period, impulse noise is not interpreted as the termination of the signal period.

It is a feature of this invention that the delay is provided by an integrating circuit which integrates the AGC voltage to further reduce the effect that impulse noise has on the S/N ratio measurement.

In a specific embodiment of this invention, the AGC voltages are applied to a first and second integrating circuit, each circuit having identical time constants to equally integrating and delaying the AGC voltages. When a valid signal is detected by the CODAN, the integrated and delayed output of one integrating circuit is held and this held output is compared with the current output of the other integrating circuit to measure the signal-to-noise ratio.

The foregoing and other objects and features of this invention will be more fully understood from the following description of an illustrative embodiment thereof taken in conjunction with the accompanying drawing.

BRIEF DESCRIPTION OF THE DRAWING

The sole FIGURE is a block diagram of an automatic gain control receiver having signal-to-noise detection capability in accordance with the present invention and discloses in schematic form the signal-to-noise measurement circuit.

DETAILED DESCRIPTION

Modulated intermittent RF transmission is received by antenna 11 as shown in the drawing. This transmission may advantageously be a single sideband reduced carrier amplitude modulated signal transmitted on a push-to-talk basis, but other forms of modulation as well as other formats for producing intermittent transmission may be used. The carrier is recovered and the RF reception is amplified by a conventional amplification stage designated RF stage 12, which stage includes a conventional carrier recovery circuit identified by block 15. Carrier recovery circuit 15 may, for example, comprise a phase locked loop which, as is well known in the art, will provide a local signal frequency and generate an error signal to modify the local frequency when the local frequency differs from the carrier frequency. Accordingly, the phase locked loop will lock on to the carrier frequency when it can detect carrier for an interval and this carrier detection is defined as recognition of a valid signal. The output of RF stage 12 is passed to IF stage 13 which recovers the IF signal. This IF signal is applied to signal detector 20 which demodulates the reception in a conventional manner to produce the demodulated output.

The amplification gain of RF stage 12 is controlled by an AGC voltage obtained from a well-known AGC circuit identified as block 14. This AGC circuit may be of the same type as described in U.S. Pat. No. 3,831,093 issued to E. H. Walker on Apr. 29, 1974. In addition, as discussed in U.S. Pat. No. 3,831,093, automatic gain control circuit 14 develops an intermediate AGC voltage which is proportional to the strength of the RF reception after transient conditions have settled out. This intermediate voltage, designated $E_{MON}$, and correspondingly designated $E_{MON}$ in the Walker patent, is used to monitor the level of the RF reception to produce the final AGC voltage passed to RF stage 12. Accordingly, it is apparent that the intermediate AGC voltage $E_{MON}$ will be relatively high during no-signal periods or conditions in order to increase the gain of the RF stage and relatively low during signal conditions in order to reduce the gain of the RF stage. This $E_{MON}$ voltage is also applied to signal-to-noise (S/N) measurement circuit 18 and is used to determine the signal-to-noise ratio.

The CODAN signal is derived from threshold detector 16. Threshold detector 16, in turn, monitors the error signal of the phase locked loop in carrier recovery circuit 15. Accordingly, when the phase locked loop has not locked on the incoming carrier, a consequent error signal is provided as is well known in the art and threshold detector circuit 16 indicates the absence of a valid signal. Alternatively, when the phase locked loop locks on the incoming carrier, the error signal of the loop is low and threshold detector 16 recognizes a valid signal and this valid signal is passed via the output CODAN lead to S/N measurement circuit 18 and to peak detector and quantizer 19.

As described in detail hereinafter, S/N measurement circuit 18 determines the signal-to-noise ratio of incoming reception by comparing AGC voltages during a no-signal period with AGC voltages generated during a signal period. This comparison is provided in response to the recognition of a valid signal by threshold detector 16 and the resultant comparison is passed to peak detector and quantizer 19.

Peak detector and quantizer 19 is substantially identical to the correspondingly identified peak detector and quantizer disclosed in the Walker patent. More specifically, peak detector 19 is initially enabled or reset by the CODAN signal indicating a valid signal detection to examine the comparison output of S/N measurement circuit 18 and to generate a digital output which corresponds to the peak difference of the comparison signals, which digital output thereby defines the signal-to-noise ratio of the input reception. This digital output is then used as a basis for selecting or not selecting the receiver for communication with the remote shipboard transmitter.

The AGC voltage levels on line $E_{MON}$ are passed to buffer amplifier 22 in S/N measurement circuit 18. The output of buffer amplifier 22 is monitored by integrators 24 and 25. These two integrators have identical time constants; the outputs of the two integrators feed difference amplifier 26. The output difference amplifier 26 is then passed to peak detector 19 which digitizes this output, as previously described, to form the basis for the level information that is used in the receiver selection process.

In the normal mode of S/N measurement circuit 18 the two inputs to difference amplifier 26 are equal since the inputs to integrators 24 and 25 are the same and the time constants of integrators 24 and 25 are identical. The output of difference amplifier 26 is therefore "0" regardless of the level of the AGC voltage. However, when a valid signal is received and threshold circuit 16 provides the CODAN signal as previously discussed, hold circuit 23 applies a signal to integrator 25 to switch this integrator into a hold mode. At this time, the output of integrator 25 defines a voltage which is a sample of the receiver's environmental noise condition just before the reception of the valid condition. In other words, the delay of integrator 25 is such that the output thereof at the moment that the CODAN signal is received is an integration of the various AGC voltage levels prior to the signal period, that is, during the prior no-signal or noise period. This voltage is maintained on the output of integrator 25 for a period of time which will reasonably include the valid signal period. On the other hand, integrators 24 will continue to produce a delayed integrated signal derived from the input AGC voltage levels and thus produce a voltage level which is an integration of the various voltage levels received during the valid signal interval. These two voltages are applied to difference amplifier 26 to produce the difference thereof, which difference is the signal-to-noise ratio of the modulating signal.

Integrators 24 and 25 are arranged in substantially the same way except for a minor difference pointed out hereinafter. The following description is directed to integrator 25, but applies equally to integrator 24.

The AGC voltage level output of buffer amplifier 22 is applied to the positive input terminal of transconductance high gain amplifier 28 in integrator 25. The integration function is provided by capacitor C4 together with resistors R8 and R22 and diode CR5. This results in the charging of the capacitor via diode CR5 and resistor R22 when a negative output potential is provided by difference amplifier 28. The capacitor, however, will discharge slowly through resistor R8 due to the reverse polling of diode CR5. The relative values of these elements, namely, capacitor C4 and resistors R8 and R22, are such that the capacitor will discharge sufficiently slowly so that a delay is provided which is sufficient in duration so that at the instant the CODAN recognizes the valid signal the capacitor charge is a function of the AGC voltages obtained from the prior no-signal period.

Assume in the initial condition that there is no charge on capacitor C4. With no charge on the capacitor, zero voltage is applied through high impedance source follower Q2 to the negative input terminal of difference amplifier 28. If an increased negative AGC voltage is now received, the positive input of amplifier 28 goes negative and the output thereof goes negative in turn. This negative voltage is passed through the relatively low impedance path of diode CR5 and resistor R23 to capacitor C4 resulting in the charging of the capacitor. The negative charge on capacitor C4 is passed by way of source follower Q2 to difference amplifier 26 and back to the negative input terminal of difference amplifier 28. This has the effect of balancing the two inputs to difference amplifier 28 to terminate charging of capacitor C4 and the integrator thereupon assumes a relative state of equilibrium.

Assume now that the AGC voltage becomes less negative, that is, goes in a positive direction. The voltage level applied to the positive input terminal of difference amplifier 28 accordingly becomes less negative than the voltage applied to the negative terminal. The output of difference amplifier 28 thereupon becomes positive, discharging capacitor C4 by way of resistor R8. The lower negative charge on capacitor C4 is similarly passed by way of source follower Q2 to difference amplifier 26 and back to the negative input terminal of difference amplifier 28 until both inputs to the difference amplifier 28 are the same and the integrator reaches substantial equilibrium.

Prior to the recognition of valid signals, threshold circuit 16 applies a negative voltage level to the CODAN lead. This negative potential is applied to the base of transistor Q1 turning it on. Ground is thus applied to the collector and this ground biases the difference amplifier 28 into the active state. When a valid signal is received, threshold circuit 16 removes the negative voltage at its output. This, in turn, turns off transistor Q1 and a negative potential is thereby passed to difference amplifier 28 to bias the difference amplifier off. With the difference amplifier biased off, the integrator is effectively disconnected from the output of buffer amplifier 22. At the same time, since difference amplifier 28 is biased off, it becomes a high impedance looking back into its output. The charge on capacitor C4 is not modified since it cannot discharge back through difference amplifier 28 and therefore the capacitor effectively holds the charge that had been priorly applied. This charge is, of course, still passed by source follower Q2 to the input of difference amplifier 26.

As previously noted, integrator 24 is substantially identical to integrator 25. The difference amplifier in integrator 24, corresponding to integrator 28, has ground permanently applied thereto so that it is always biased into the active state. The output of integrator 24 therefore continues to "sample" the AGC voltages after the CODAN signal.

Although a specific embodiment of this invention has been shown and described, it will be understood that various modifications may be made without departing from the spirit of this invention.

I claim:

1. In a receiver for intermittent signals which comprises periods of radio signals separated by no-signal periods of noise and including means (14) responsive to the reception of radio signals and noise for generating signal strength signals, means (16) responsive to the reception of radio signals for recognizing a radio signal period and a peak difference comparator (26, 19) responsive to the recognizing means for determining the difference in levels of signal strength signals derived from a radio signal period and an adjacent noise period characterized by means (24, 25) for delaying the signal strength signals, means (23, 28, C4) responsive to the recognition of a radio signal period for storing the delayed signal strength signal derived from the prior noise period and means for applying the stored signal and the current delayed signal strength signal to the peak difference comparator.

2. In a receiver, in accordance with claim 1, wherein the delaying means includes means for integrating the signal strength signals to provide a delayed integrated signal strength level derived from received signals.

3. In a receiver, in accordance with claim 2, wherein the time constants of the integrating means provides a delay which is of sufficient duration to provide an integrated signal strength signal derived from the prior noise period at the instant that the radio signal period is recognized.

4. In a receiver, in accordance with claim 1, wherein the delaying means includes a first and second integrating means having identical time constants for correspondingly integrating and delaying the signal strength signals and wherein the storing means includes means for holding the integrated and delayed signal strength signal of the first integrating means.

* * * * *